US009100001B2

(12) United States Patent
Groot et al.

(10) Patent No.: US 9,100,001 B2
(45) Date of Patent: Aug. 4, 2015

(54) POWER-SWITCH TEST APPARATUS AND METHOD

(75) Inventors: Cas Groot, Antwerp (BE); Rinze Meijer, Herkenbosch (NL)

(73) Assignee: NXP B.V., Eindhoven (NL)

( * ) Notice: Subject to any disclaimer, the term of this patent is extended or adjusted under 35 U.S.C. 154(b) by 1027 days.

(21) Appl. No.: 13/208,819

(22) Filed: Aug. 12, 2011

(65) Prior Publication Data

US 2013/0038361 A1    Feb. 14, 2013

(51) Int. Cl.
*G01R 31/02*    (2006.01)
*H03K 19/00*    (2006.01)

(52) U.S. Cl.
CPC .................................. *H03K 19/0013* (2013.01)

(58) Field of Classification Search
None
See application file for complete search history.

(56) References Cited

U.S. PATENT DOCUMENTS 5,585,731 A * 12/1996 Tsuchida et al. ............. 324/537
7,868,640 B2 * 1/2011 Agarwal et al. ......... 324/762.02

2005/0200406 A1    9/2005    Dauphinee et al.
2010/0045327 A1    2/2010    Chen et al.
2010/0231252 A1    9/2010    Goel et al.

FOREIGN PATENT DOCUMENTS

JP    2006-170878    6/2006
WO    01/81937 A2    11/2001

OTHER PUBLICATIONS

Extended European Search Report for Patent Appln. No. 12178245.2 (Nov. 22, 2013).
Goel, et al. "Efficient testing and diagnosis of faulty power switches in SOCs", Computers & Digital Techniques, IET, vol. 1, No. 3, pp. 230-236, May 2007.

* cited by examiner

*Primary Examiner* — Paresh Patel

(57) ABSTRACT

Power switching is facilitated. In accordance with one or more embodiments, a power-switch apparatus includes a plurality of switches coupled between a voltage supply and a switched voltage output. A test control circuit operates the switches for testing a subset thereof, therein indicating a condition of the subset, which may be indicated independently from a condition of the power-switch apparatus as a whole. In some implementations, on-chip current loads are applied to emulate off-chip loads for testing the subset of switches, or individual switches.

20 Claims, 3 Drawing Sheets

POWER-SWITCH TEST APPARATUS AND METHOD

Many integrated circuits employ power switches for a variety of uses, such as for providing various power levels, different power domains, and other functions for integrated circuits. In many applications, multiple power domains are often used to reduce leakage current by shutting down the power supply to unused circuit modules using a power switch.

As the complexity of such integrated circuits increases, multiple power switches are often implemented. Generally, power switches connect the power domain with a supply if active operation is required, and disconnect the domain if active operation is not required (e.g., for standby mode). The power switches are often controlled using a control signal, which can be implemented using a digital control signal (e.g., for mixed-signal devices).

With increasing numbers of power switches and related complexity, the complexity of testing such circuits increases as well. For example, identifying the supply voltage of each power domain for testing can be particularly challenging to implement in an efficient and economical manner. In addition, certain power testing approaches require dedicated pads, and involve connections that may introduce undesirable resistance and related voltage drop that affect testing measurements, and involve additional overhead. Certain such approaches are also difficult to implement in connection with the use of external power loads.

These and other matters have presented challenges to the implementation of power switches for controlling different power domains in an integrated circuit chip.

Various example embodiments are directed to power supply, to testing power domains within power supply circuitry, and to addressing various challenges including those discussed above.

According to an example embodiment, a power-switch apparatus includes a plurality of individual power switches coupled between a voltage supply and a switched voltage output, a test control circuit, a current generation circuit and an output circuit. The test control circuit is coupled to each of the power switches and operates at least one of the power switches in an "ON" condition for providing the switched voltage output, in response to a test signal received at the at least one of the power switches, while operating at least another one of the respective power switches in an off condition. The current generation circuit is coupled to the switched voltage output and emulates an expected current draw for the respective power switches. The output circuit is coupled to receive the switched voltage output, compare a value of the switched voltage output to a reference value, and provide a test output indicative of an operational characteristic of the power switches operated in the on condition, based on the comparison.

Another example embodiment is directed to method for testing a power-switch apparatus having a plurality of power switches coupled between a voltage supply and a switched voltage output. At least one of the power switches is operated in an on condition for providing the switched voltage output, in response to a test signal received at the at least one of the power switches, while operating at least another one of the respective power switches in an off condition. An expected current draw for the respective power switches is emulated from the switched voltage output. A value of the switched voltage output is compared to a reference value and, in response to the comparison, a test output is provided to indicate an operational characteristic of the power switches operated in the on condition.

The above discussion is not intended to describe each embodiment or every implementation of the present disclosure. The figures and following description also exemplify various embodiments.

Various example embodiments may be more completely understood in consideration of the following detailed description in connection with the accompanying drawings, in which.

Figure 1:
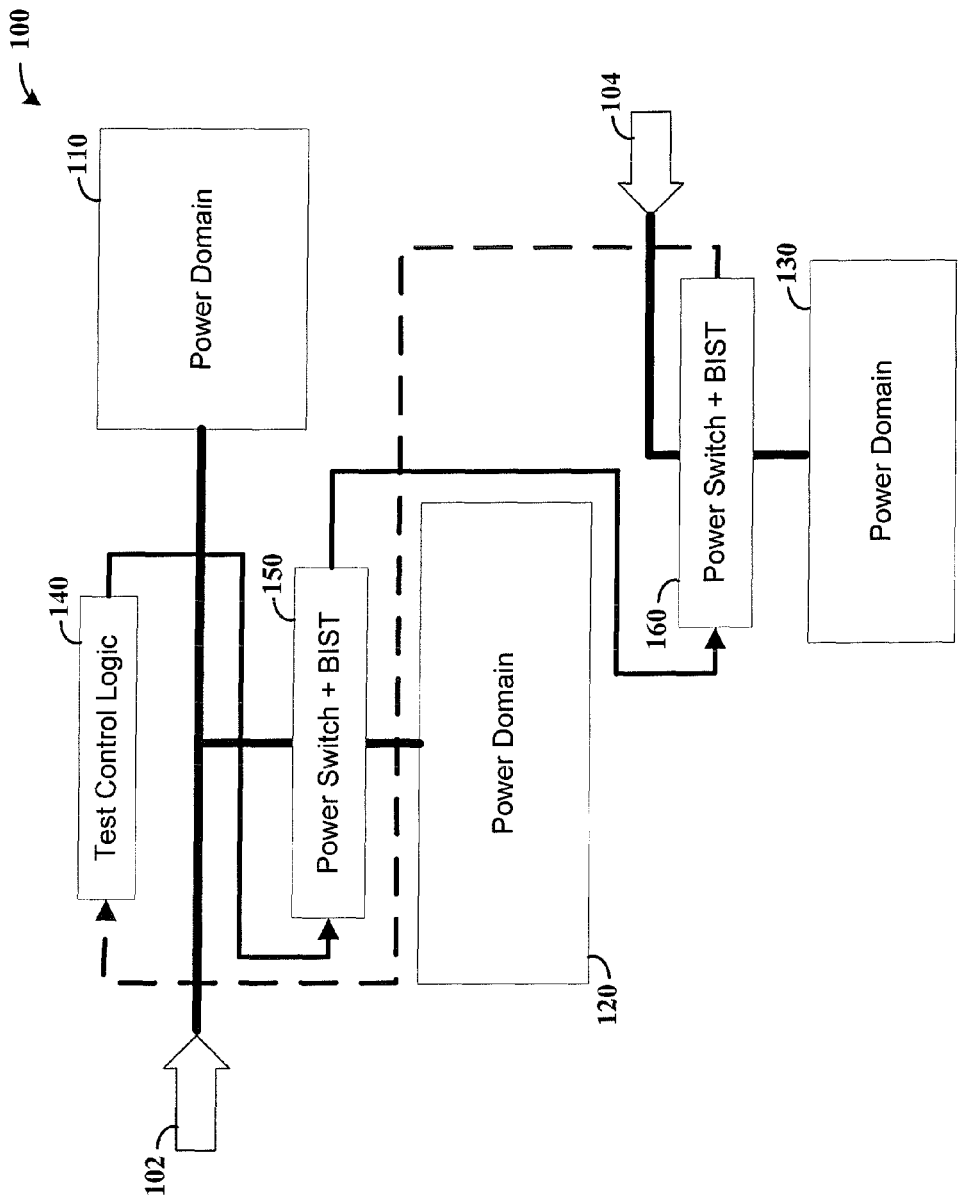
FIG. 1 shows a power circuit having built-in self-test circuits, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention, including aspects defined in the claims.

The present invention is believed to be applicable to a variety of different types of circuits, devices and systems for providing power to integrated circuits, and for testing power switches used in providing power. While the present invention is not necessarily limited in this context, various aspects of the invention may be appreciated through a discussion of related examples.

In accordance with various example embodiments, an on-chip power-switch testing approach involves verifying aspects, such as supply voltage and IR drop, of a subset of power supply circuits during a specified load for power supply circuitry. In many applications, such an approach involves testing individual segments of a power-switching circuit, with each segment including at least one individual (power) switch, to determine characteristics of each portion as well as the entire power-switching circuit. This segment-based approach can be implemented with one or a group of segments, to suit particular applications. For example, the virtual supply voltage of each segment can be identified along with the voltage drop (e.g., IR drop) of the related power switch (or switches) for a specified current load, which can be an artificial load. The identified supply voltage and IR drop can be used to provide an indication of performance of each switch. Various implementations are also directed to testing power supply using various related parameters, such as wake-up time.

Where individual switch or circuit performance is not necessarily ascertained, test results from an entire circuit (or large groups of individual switching circuits) can be provided. By ascertaining information regarding circuit functionality for individual circuits or a subset of circuits, an evaluation of the health of an entire circuit (and, e.g., expected longevity) can be more accurately ascertained. For example, in power circuits with a large number of individual components, variations in an output of the entire system may not be indicative of a failure of individual components that do not significantly contribute to the total output. Moreover, by testing less than an entire circuit, smaller power supply lines can be used as each individual circuit or subsets of individual circuits draw less power than the entire circuit.

In some implementations, individual power-switch circuits are tested using a virtual power supply, with a current generation circuit (e.g., a current mirror) between the virtual supply and the ground as a current load. The virtual supply from the respective power circuits (e.g., a voltage corresponding to an input voltage switched by the power circuits) is fed to a voltage comparator and compared to a voltage reference from an actual power supply. The output of the voltage comparator is indicative of functionality of a power-switch circuit, or a subset of power-switch circuits, that are coupled to the virtual supply and provide an output to the comparator. The output of the comparator is provided (e.g., to a test control unit and/or further test logic) as an indication of the functionality of a power-switch circuit or subset thereof.

A variety of different types of power switches can be used and/or tested, in accordance with various example embodiments. For example, the size of a power switch can be set in response to a design maximum current consumption of a power domain to be switched, and can be implemented using multiple daisy-chained segments. In such an example, the acknowledge output of a first power switch can be connected to the enable input of a second power switch, and so on through the chain of segments. In order to switch a power-gated domain from standby to active, the power switch is turned on first, and the domain is charged to a supply voltage ($V_{DD}$) that is set as required for the particular application. Such a power-switch segment can be used in different manners, such as for connecting one or both of a $V_{DD}$ rail and a ground rail. Accordingly, the various examples herein describing the connection (and disconnection) of a $V_{DD}$ rail can be implemented with a ground rail (or other rail, such as a standby power rail).

Turning now to the figures, FIG. 1 shows a power circuit 100 having built-in self test circuits, in accordance with an example embodiment of the present invention. The circuit 100 includes power domains 110, 120 and 130, as well as test control logic 140 and daisy-chained BIST switch circuits 150 and 160. Arrows 102 and 104 may be implemented as on-chip pads, or on-chip power management units such as an LDO (low-dropout) regulator. The test control logic 140 coordinates functions of the respective BIST switch circuits 150 and 160 during testing of the circuits for respectively providing power to power domains 120 and 130. The test control logic 140 provides test signals to the BIST switch circuits under various conditions, such as to individually test power switches or subsets of switch circuits within or among different power domains.

Specifically, the test control logic 140 is coupled to output test control signals to the BIST switch circuit 150, for use in testing BIST switch circuits 150 and 160. The BIST switch circuit 150 is responsive to the received test control signals under a test condition, and outputs test result signals as well test control signals to the BIST switch circuit 160. The BIST switch circuit 160 is responsive to the test control signals received from the BIST switch circuit 150 under a test condition, and outputs test result signals for both of the BIST switch circuits 150 and 160 to the test control logic 140. Accordingly, the switch circuits may be tested separately or concurrently, to suit the particular application.

The test control logic 140 uses the test result signals received from the BIST switch circuit 160 (and also including test result signals from BIST switch circuit 150), to provide an indication of a condition of the respective switch circuits. In certain implementations, the test control logic 140 may generate signals for testing only one of the BIST switch circuits, passing test signals as above, with result signals from the tested power domain being passed back to the test control logic 140. In other implementations, additional BIST switch circuits are connected in daisy-chain fashion as shown and tested, with a last of these circuits connected to provide test results back to the test control logic 140.

Using such BIST components, the power circuit 100 facilitates testing of individual switch circuits for respective power domains, while mitigating the need for a large power connection and dedicated pad(s), which can further reduce test time overhead. Accordingly, power capabilities of individual components can be tested and assessed to more accurately represent the ability of the entire circuit 100 to provide power. This approach facilitates desirable testing of less than an entire circuit, as discussed above.

Testing and related functions carried out via the BIST switch circuits 150 and 160 can be implemented using a variety of different types of testing approaches. In some implementations, the BIST switch circuits 150 and 160 detect a virtual voltage (or combined voltage), a voltage drop for a specified load (or combined voltage drop), and/or a signal delay such as may occur between enable and acknowledge signals. In this regard, while various embodiments are described in connection with certain testing approaches (e.g., for verifying the voltage drop of power-switch segments with a specified load applied), such embodiments are applicable for implementation with a multitude of different testing approaches.

Figure 2:
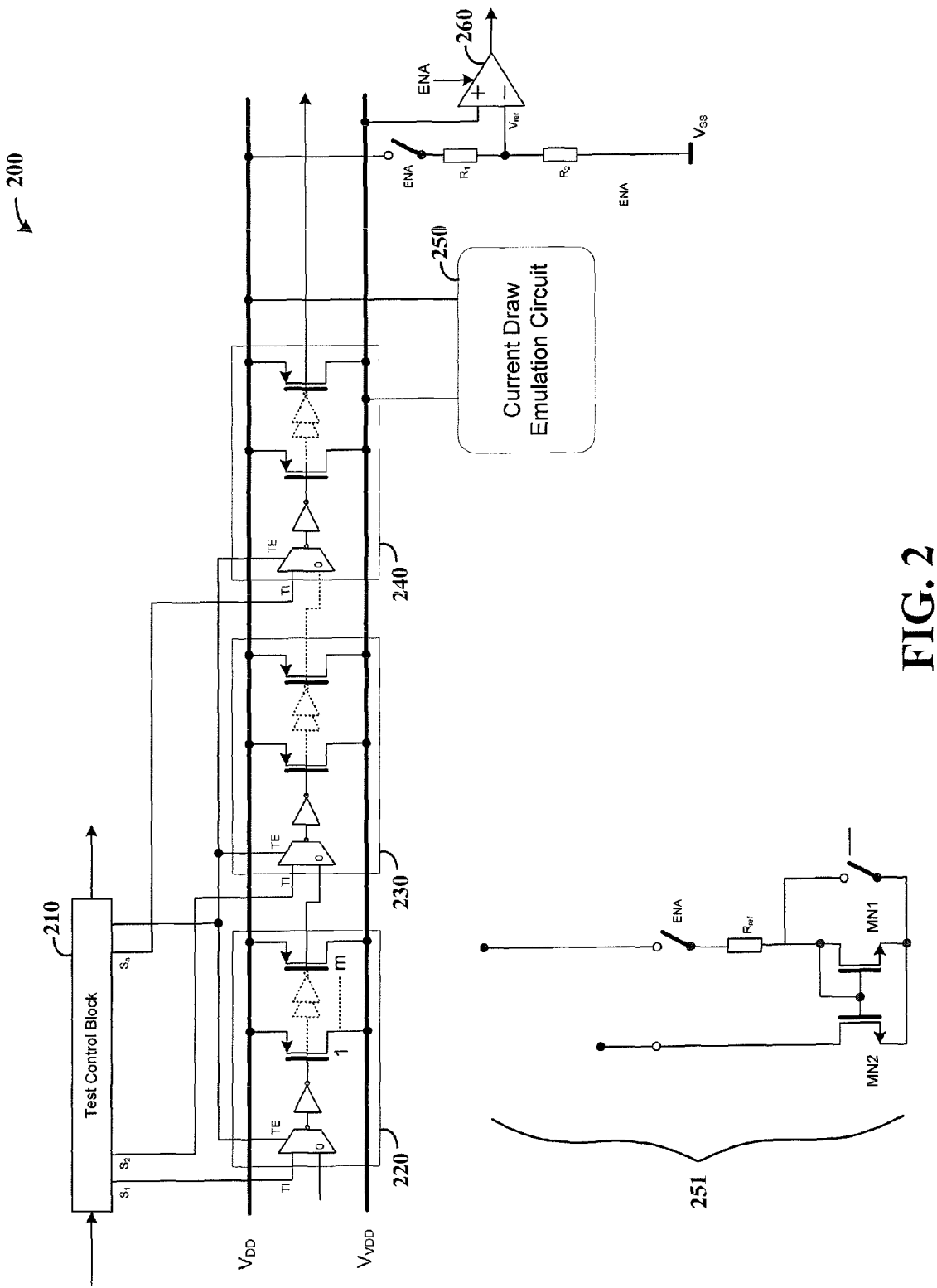
FIG. 2 shows a power circuit with built-in self-test components, in accordance with another example embodiment of the present invention.

In a more particular example embodiment, and referring to FIG. 2, a power circuit 200 includes built-in self test components with combined power-switch segments, in accordance with another example embodiment of the present invention. The power circuit 200 includes a test control block 210, such as a switch control register, which facilitates the control/activation of power-switch segments 220, 230 and 240, which are coupled to power supply $V_{DD}$ and a virtual power supply $V_{VDD}$.

Each power-switch segment includes one or more transistors, as represented by transistors 1-m as shown in switch segment 220, coupled between $V_{DD}$ and $V_{VDD}$, with corresponding power-switch drivers. The test control block 210 provides a select output (TE) to set multiplexers in each power-switch segment to a test mode, which allows the test control block to enable and disable explicit subsets of power-switch segments. The test control block 210 also provides test outputs $S_1$-$S_n$ as inputs (T1) to the multiplexers, with the number n corresponding to n number of power-switch segments. In various implementations, the test control block 210 generates different test vectors for different switch segments or clusters of segments, to tailor the testing thereof.

A current generation circuit 250 acts as a load for testing the power-switch segments 220, 230 and 240, and the output of the power-switch circuits on $V_{VDD}$ is provided to a comparator 260. In some implementations, this current generation circuit 250 is used by two or more circuits, acting as the aforesaid load (e.g., for other power-switch/built-in-self test blocks). The comparator 260 compares the output on $V_{VDD}$ with the output on $V_{DD}$, and provides an output as an indication of the operability of the one or more of the power-switch segments 220, 230 and 240 operated for the particular test. In some implementations, the output of the comparator is stored in a register or other storage circuit, which may be included as part of the power circuit 200.

The current generation circuit 250 may be implemented in a variety of manners, such as with a current mirror or other current source-type devices (e.g., as may be similar to a charge pump, variations on current mirrors and other circuits). In some implementations, the current generation circuit 250 is implemented as a current mirror-type circuit shown by way of example at 251, and including two NMOS transistors MN1 and MN2, as well as a resistor $R_{ref}$. The ratio of MN1 and MN2 in combination with the resistance of $R_{ref}$ defines the current drawn from the active power-switch segments. Accordingly, these components can be sized and implemented to a particular current draw, as may be desirable for a particular testing approach. For example, a poly resistance can be used to implement the resistor $R_{ref}$, with a desirably small area, current flowing through MN1 can be set relatively large, and the size of transistor MN2 can be selected such that the desired current is matched to a cluster of power-switch segments to be tested. In some implementations, the current generation circuit 250 is configured to draw variable current (e.g., by selecting and implementing different transistors), as may be set based upon the number and/or characteristics of power switches to be tested.

A determination of operability of the power-switch segments can be made based upon a variety of test characteristics and metrics. For example, when the current of an active power-switch segments cluster (e.g., one of switch segments 220, 230 and 240 operated for a particular test) and current generation circuit are equivalent, the virtual voltage ($V_{VDD}$) should be equal or larger than about 0.5 times $V_{DD}$, with $R_1$, $R_2$ and the respective current generation circuit components configured appropriately. If the output of the comparator 260 is indicative of this ratio, this output is an indication that the clustered power-switch segments passed the test (e.g., are operating properly). If the virtual voltage is lower than 0.5 times $V_{DD}$, the output of the comparator 260 is not indicative of the aforesaid ratio and is indicative of the clustered power-switch segments having failed.

In various embodiments, and referring again to FIG. 2 by way of example, at least one of the power-switch segments is differently sized relative to another segment, resulting in a different voltage drop introduced by a current generation circuit 251 as shown, since its load is static. Testing of such a circuit may be facilitated using, for example, a dynamic current mirror (e.g., with different transistors that are switched to provide an appropriate current draw). This dynamic current mirror can be created by replacing MN2 of circuit 251 with multiple transistors, which can be enabled individually. These individual current mirror transistors can be linked to the corresponding segment control register to match the current load with the power-switch segment to be tested. In another implementation, specific power-switch segments are clustered to create approximately equally sized subsets, which facilitates the use of a single/static current mirror (as the current generation circuit shown in FIG. 2) to provide the correct load for the subset of power-switch segments. Still other implementations are directed to a combination of using a dynamic current mirror and selective clustering, relaxing power-switch segment clustering constraints while limiting the number of individual current mirror transistors.

Figure 3:
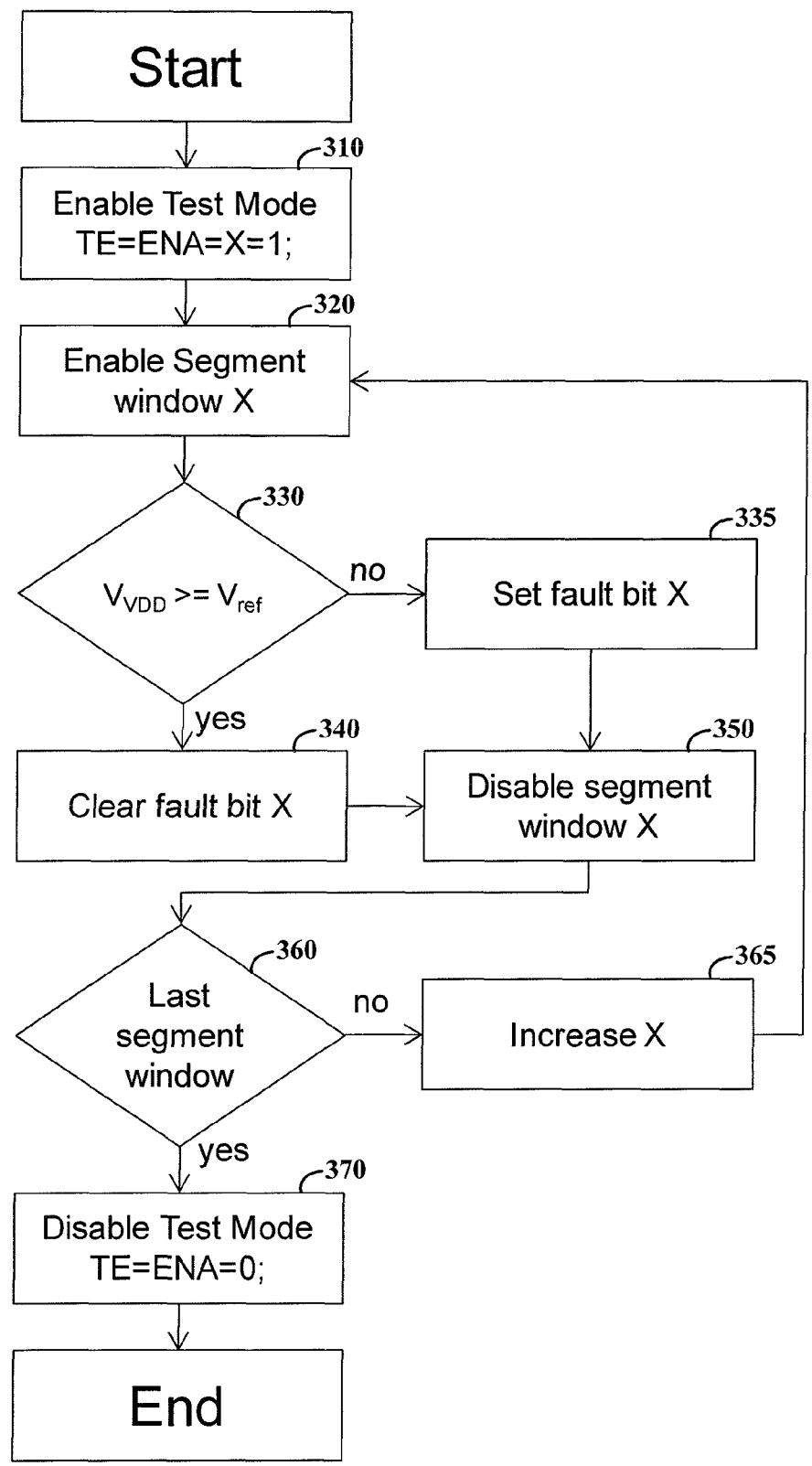
FIG. 3 shows a flow diagram for testing a power circuit, in accordance with another example embodiment of the present invention.

FIG. 3 shows a flow diagram for testing a power circuit, in accordance with another example embodiment of the present invention. The operation of the power circuit as represented in FIG. 3 can be made with reference to the operation of a circuit such as that shown in FIG. 2, with the following discussion using such a comparison. However, it should be understood that the approach shown in FIG. 3 can be implemented with a variety of different types of circuits and is thus not limited to the circuit shown in FIG. 2 or to circuits as otherwise described herein.

Upon start, a test mode is enabled at block 310, with output TE=1, ENA=1 and X=1. At block 320, a segment window (X, by way of example) is enabled for testing a particular segment. The test enable (TE) signal can be implemented as a global signal used over an entire chip, with the enable (ENA) controlling local test circuitry (e.g., current mirror, reference voltage, and comparator). The segment window X represents a control signal for power-switch segments such as 220, 230 and 240, with each group having its own control signal. When the power-switch segment window is enabled, virtual voltage ($V_{VDD}$) will charge, and dependent on the current load, reach a certain value.

In one embodiment, the current load is selected to equal the power-switch segment window load, resulting in $V_{VDD}=V_{DD}/2$ (with the switches operating properly). Accordingly, $V_{ref}$ is selected to be equal to $V_{DD}/2$. If the $V_{VDD}$ is larger than or equal to $V_{ref}$ at block 330, the power-switch segments being tested are determined as operating as specified, and fault bit X is cleared at block 340. However, if $V_{VDD}$ is smaller than $V_{ref}$ at block 330, the power-switch segments in the current window are determined as not operating as specified and the fault bit X is set at block 335.

After segment window X has been tested, the segment window is disabled at block 350. If the last segment in the power circuit has been tested at block 360, the test mode is disabled at block 370, and the test is complete. If the last segment has not been tested at block 360, the segment number X is increased at block 365 to denote a next segment, and the process repeats with this next segment at block 320. At the end of the whole procedure, this fault register represents the power-switch status. At the end of the process (at block 370), if all bits are 0, no error is detected. If one or more bits are 1, a malfunction in the represented segment window is detected.

The testing circuits and approach as discussed herein thus may, for example, be implemented as part of a manufacturing process to detect failed power switches as an indication of an expected longevity of a particular power-switch circuit involving a plurality of such switches. This approach may also be implemented during implementation of the power-switch circuit, to predict failure and/or suggest replacement. In one particular implementation, an integrated circuit includes a spare power supply circuit, and is configured to route power supply from a power supply circuit detected as exhibiting a failure, via the spare power supply circuit.

The various embodiments as described herein can be implemented using one or more of a variety of approaches, in a variety of different applications. For example, individual power switches, or segments/blocks of power switches, can be used in power gating for an integrated circuit, and tested as discussed herein. Example applications include microcontrollers for e-metering, hearing aids, wireless sensor networks and integrated circuits for mobile applications.

Based upon the above discussion and illustrations, those skilled in the art will readily recognize that various modifications and changes may be made to the present invention without strictly following the exemplary embodiments and applications illustrated and described herein. For example, dynamic current mirrors may be implemented in place of static current mirrors, and different sets of switches can be grouped. Further, test signals and control signals may be provided in different manners and implemented to achieve the indicated operation of individual and/or subsets of switches. Such modifications do not depart from the true spirit and scope of the present invention, including that set forth in the following claims. Furthermore, the term "example" as used throughout this document is by way of illustration, and not limitation.

What is claimed is:

1. A power-switch apparatus comprising:
a plurality of power-switching circuits coupled between a voltage supply and a switched voltage output;
a test control circuit coupled to each of the power-switching circuits and configured and arranged to operate at least one of the power-switching circuits in an on condition for providing the switched voltage output, in response to a test signal received at the at least one of the power-switching circuits, while operating at least another one of the respective power-switching circuits in an off condition;
a current emulation circuit coupled to the switched voltage output and configured and arranged to emulate an expected current draw for the respective power-switching circuits under at least one load condition; and
an output circuit coupled to receive the switched voltage output and configured and arranged to
compare a value of the switched voltage output to a reference value, and
in response to the comparison, provide a test output indicative of an operational characteristic of the power-switching circuits operated in the on condition.

2. The apparatus of claim 1, wherein the test control circuit is configured and arranged to operate different subsets of the power-switching circuits in the on condition during different test cycles to separately test each of the respective subsets relative to the other subsets in respective ones of the test cycles.

3. The apparatus of claim 1, wherein
different subsets of the power-switching circuits draw different power levels,
the test control circuit is configured and arranged to operate the different subsets of the power-switching circuits in the on condition during different test cycles to separately test each of the respective subsets relative to the other subsets in respective ones of the test cycles, and
the current emulation circuit is a dynamic current mirror circuit configured and arranged to respond to the test control circuit by providing a current draw corresponding to the particular subset of power-switching circuits being tested.

4. The apparatus of claim 1, wherein
different ones of the power-switching circuits draw different power levels,
the test control circuit is configured and arranged to combine different ones of the power-switching circuits into respective subsets to create subsets exhibiting an about equal current draw.

5. The apparatus of claim 1, wherein
different ones of the power-switching circuits draw different power levels,
the test control circuit is configured and arranged to combine different ones of the power-switching circuits into respective subsets to create subsets exhibiting an about equal current draw,
the test control circuit is configured and arranged to operate the respective subsets of the power-switching circuits in the on condition during different test cycles to separately test each of the respective subsets relative to the other subsets in respective ones of the test cycles, and
the current emulation circuit is a dynamic current mirror circuit configured and arranged to respond to the test control circuit by providing a current draw corresponding to the particular subsets being tested.

6. The apparatus of claim 1, wherein the test control circuit is configured and arranged to provide the test signals to each switch.

7. The apparatus of claim 1, wherein the power-switching circuits, test control circuit, current emulation circuit and output circuit are integrated on a common integrated circuit chip.

8. The apparatus of claim 1, wherein the current emulation circuit is coupled to a switched voltage output for a different plurality of power-switching circuits, and configured and arranged to emulate an expected current draw for the different plurality of power-switching circuits by drawing a variable current, based at least in part on characteristics of the plurality of power-switching circuits tested.

9. The apparatus of claim 1, wherein
the power-switching circuits, test control circuit, current emulation circuit and output circuit are integrated on a common integrated circuit chip,
the current emulation circuit is configured and arranged to emulate an expected off-chip current load, and
the output circuit includes a comparator that compares the value of the switched voltage output to the reference value by comparing the switch voltage output to a reference voltage provided via the voltage supply.

10. The apparatus of claim 1, wherein the output circuit is configured to set an output corresponding to at least one of the power-switching circuits tested in a test cycle, based upon the comparison of the value of the switched voltage output to the reference value, to provide an indication of the operability of the at least one of the power-switching circuits.

11. The apparatus of claim 1, wherein the test control circuit is configured and arranged to
separately test different groups of the power-switching circuits, and
process the test output as provided for each group of power-switching circuits to provide an indication of operability of each group of power-switching circuits within the power-switch apparatus.

12. The apparatus of claim 1, wherein the test control circuit is configured and arranged to generate different test vectors for operating different subsets of the power-switching circuits under a specified load configuration.

13. A method for testing a power-switch apparatus having a plurality of power-switching circuits coupled between a voltage supply and a switched voltage output, the method comprising:
operating at least one of the power-switching circuits in an on condition for providing the switched voltage output in response to a test signal received at the at least one of the power-switching circuits, while operating at least another one of the respective power-switching circuits in an off condition;
emulating an expected current draw for the respective power-switching circuits, from the switched voltage output, by manipulating the switched voltage output to emulate at least one expected load condition of the switched voltage output;
comparing a value of the switched voltage output to a reference value; and
in response to the comparison, providing a test output indicative of an operational characteristic of the power-switching circuits operated in the on condition.

14. The method of claim 13, wherein operating at least one of the power-switching circuits includes operating different subsets of the power-switching circuits in the on condition during different test cycles to separately test each of the respective subsets relative to the other subsets in respective ones of the test cycles.

15. The method of claim 13, wherein
different subsets of the power-switching circuits draw different power levels,
operating at least one of the power-switching circuits includes operating the different subsets of the power-switching circuits in the on condition during different test cycles to separately test each of the respective subsets relative to the other subsets in respective ones of the test cycles, and
emulating an expected current draw includes drawing current that mirrors an expected current drawn by the particular subset of power-switching circuits being tested.

16. The method of claim 13, wherein
different subsets of the power-switching circuits draw different power levels, and
operating at least one of the power-switching circuits includes concurrently operating different ones of the power-switching circuits at different times to operate subsets of the power-switching circuits exhibiting an about equal current draw.

17. The method of claim 13, wherein
different subsets of the power-switching circuits draw different power levels,
operating at least one of the power-switching circuits includes
concurrently operating different ones of the power-switching circuits at different times to operate subsets of the power-switching circuits exhibiting an about equal current draw, and
operating the different subsets of the power-switching circuits in the on condition during different test cycles to separately test each of the respective subsets relative to the other subsets in respective ones of the test cycles, and
emulating an expected current draw includes mirroring a current draw that is dynamically changed to match the expected current draw for the subset being tested.

18. The method of claim 13, further including setting a bit corresponding to each of the at least one of the power-switching circuits tested in a test cycle, based upon the comparison of the value of the switched voltage output to the reference value, to provide an indication of an operability of the at least one of the power-switching circuits.

19. The method of claim 13, wherein emulating an expected current draw includes emulating different current draws for different sets of power-switching circuits.

20. The method of claim 13, wherein operating at least one of the power-switching circuits in an on condition includes providing test vectors to operate different subsets of the power-switching circuits.

* * * * *